United States Patent
Solmeyer et al.

(10) Patent No.: US 12,339,338 B2
(45) Date of Patent: Jun. 24, 2025

(54) INTEGRATED PHOTONIC RESPONSIVE MATERIAL SENSOR

(71) Applicant: Honeywell International Inc., Charlotte, NC (US)

(72) Inventors: Neal Eldrich Solmeyer, Edina, MN (US); Matthew Wade Puckett, Phoenix, AZ (US); Matthew Robbins, Minneapolis, MN (US); Jianfeng Wu, Tucson, AZ (US); Mary Salit, Plymouth, MN (US)

(73) Assignee: Honeywell International Inc., Charlotte, NC (US)

( * ) Notice: Subject to any disclaimer, the term of this patent is extended or adjusted under 35 U.S.C. 154(b) by 73 days.

(21) Appl. No.: 18/165,894

(22) Filed: Feb. 7, 2023

(65) Prior Publication Data

US 2024/0264255 A1    Aug. 8, 2024

(51) Int. Cl.
*G01R 33/345*    (2006.01)
*G01R 33/26*     (2006.01)

(52) U.S. Cl.
CPC ........... *G01R 33/345* (2013.01); *G01R 33/26* (2013.01)

(58) Field of Classification Search
None
See application file for complete search history.

(56) References Cited

U.S. PATENT DOCUMENTS 7,043,117 B2   5/2006  Matsko et al.
7,266,258 B2   9/2007  Liu et al.
9,726,733 B2   8/2017  Smith et al.
9,823,313 B2 * 11/2017 Hahn .............. G01R 33/60
9,910,105 B2   3/2018  Boesch et al.
(Continued)

FOREIGN PATENT DOCUMENTS

CN    104198967 A   12/2014
CN    113568246 A   10/2021
(Continued)

OTHER PUBLICATIONS

Bougas et al., "On the Possibility of Miniature Diamond-Based Magnetometers Using Waveguide Geometries", Micromachines 2018, 9, 276, Jun. 1, 2018, pp. 1 through 11, MDPI.
(Continued)

*Primary Examiner* — Jas A Sanghera
(74) *Attorney, Agent, or Firm* — Fogg & Powers LLC

(57) ABSTRACT

Systems for an integrated photonic responsive material sensor are described herein. In certain embodiments, a system includes a carrier wafer that includes a cavity formed in the carrier wafer. The carrier wafer also includes a responsive waveguide coupled to the cavity, the responsive waveguide formed from responsive material responsive to a force by shifting a resonance frequency of point defects in the responsive material in response to the force, wherein a pump light is directed to the responsive waveguide to prepare the responsive waveguide to absorb a probe light when exposed to a radio frequency at the point defect resonance frequency. Additionally, the system includes components coupled to the carrier wafer, wherein the components include a probe light source that generates the probe light, wherein the components are positioned in relation to the carrier wafer to couple the probe light into the cavity.

20 Claims, 3 Drawing Sheets

(56) References Cited

U.S. PATENT DOCUMENTS

| | | |
|---|---|---|
| 10,082,545 B2 | 9/2018 | Jeske et al. |
| 10,114,083 B2 | 10/2018 | Forstner et al. |
| 10,126,377 B2 | 11/2018 | Hahn et al. |
| 10,317,279 B2 | 6/2019 | Bruce et al. |
| 10,330,744 B2 | 6/2019 | Luzod |
| 10,371,765 B2 | 8/2019 | Kaup et al. |
| 10,677,953 B2 | 6/2020 | Stetson et al. |
| 10,901,054 B1 | 1/2021 | Chen et al. |
| 11,119,163 B2 | 9/2021 | Puckett et al. |
| 11,131,619 B2 | 9/2021 | Ozdemir et al. |
| 11,199,733 B2 | 12/2021 | Puckett et al. |
| 11,300,639 B2 | 4/2022 | Solmeyer et al. |
| 2003/0185514 A1 | 10/2003 | Bendett et al. |
| 2013/0265042 A1 | 10/2013 | Kawabata et al. |
| 2014/0354275 A1 | 12/2014 | Sheng et al. |
| 2016/0134078 A1 | 5/2016 | Gaeta et al. |
| 2016/0231394 A1 | 8/2016 | Manickam et al. |
| 2016/0356863 A1 | 12/2016 | Boesch et al. |
| 2017/0023487 A1 | 1/2017 | Boesch |
| 2017/0343621 A1 | 11/2017 | Hahn et al. |
| 2018/0275210 A1 | 9/2018 | Luzod |
| 2019/0018076 A1 | 1/2019 | Hahn et al. |
| 2019/0018087 A1 | 1/2019 | Hahn et al. |
| 2019/0219645 A1 | 7/2019 | Hahn et al. |
| 2020/0018802 A1 | 1/2020 | Palacios Laloy et al. |
| 2020/0192007 A1 | 6/2020 | Kwak et al. |
| 2021/0103010 A1* | 4/2021 | Rosenfeld ............. G01R 33/24 |
| 2021/0103166 A1* | 4/2021 | Puckett ............... G01R 33/032 |
| 2021/0132163 A1 | 5/2021 | Puckett et al. |
| 2021/0255260 A1* | 8/2021 | Solmeyer ............ G01R 33/022 |
| 2022/0121084 A1 | 4/2022 | Bowers et al. |

FOREIGN PATENT DOCUMENTS

| | | |
|---|---|---|
| DE | 102019203930 A1 | 9/2020 |
| EP | 3248021 A1 | 11/2017 |
| GB | 2408796 A | 6/2005 |
| JP | 6142025 B2 | 6/2017 |
| WO | 2007049260 A1 | 5/2007 |
| WO | 2019002576 A1 | 1/2019 |

OTHER PUBLICATIONS

Dumeige, et al., "Infrared laser threshold magnetometry with a NV doped diamond intracavity etalon", Optics Express, vol. 27, No. 2, Jan. 21, 2019, pp. 1706 through 1717.

Hausmann et al., "An on-chip diamond optical parametric oscillator", arX1v:1309.1178v1, [physics.optics], Sep. 4, 2013, pp. 1 through 7.

Jensen et al., "Cavity-Enhanced Room Temperature Magnetometry Using Absorption by Nitrogen-Vacancy Centers in Diamond", Physical Review Letters, PRL, 112, 160802, Week ending Apr. 25, 2014, pp. 160802-1 through 160802-5.

Knauer et al., " Structured Polymer Waveguides On Distributed Bragg Reflector Coupling To Solid State Emitter", Journal of Optics 19(6), [065203]. 2017, https://doi.org/10.1088/2040/8986/aa6a70, pp. Cover pages through 9.

Sergaeva, et al., Resonant Dielectric Waveguide-Based Nanostructure for Efficient Interation With Color Centers in Nanodiamonds, Nanosystems: Physics, Chemistry, Mathematics, 2019, 10 (3), PACS 42.25.Fx, 42.79.e, 42.82 Gw, DOI 10.17586/2220-8054-2019-10-3-266-272, pp. 266-272.

U.S. Patent and Trademark Office, "Notice of Allowance", U.S. Appl. No. 16/786,495, filed Apr. 30, 2021, pp. 1 through 18, Published: US.

U.S. Patent and Trademark Office, "Notice of Allowance", U.S. Appl. No. 16/788,819, filed Aug. 18, 2021, pp. 1 through 9, Published: US.

U.S. Patent and Trademark Office, "Notice of Allowance", U.S. Appl. No. 17/027,450, filed Dec. 3, 2021, pp. 1 through 13, Published: US.

U.S. Patent and Trademark Office, "Office Action", U.S. Appl. No. 16/788,819, filed Apr. 13, 2021, pp. 1 through 10, Published: US.

\* cited by examiner

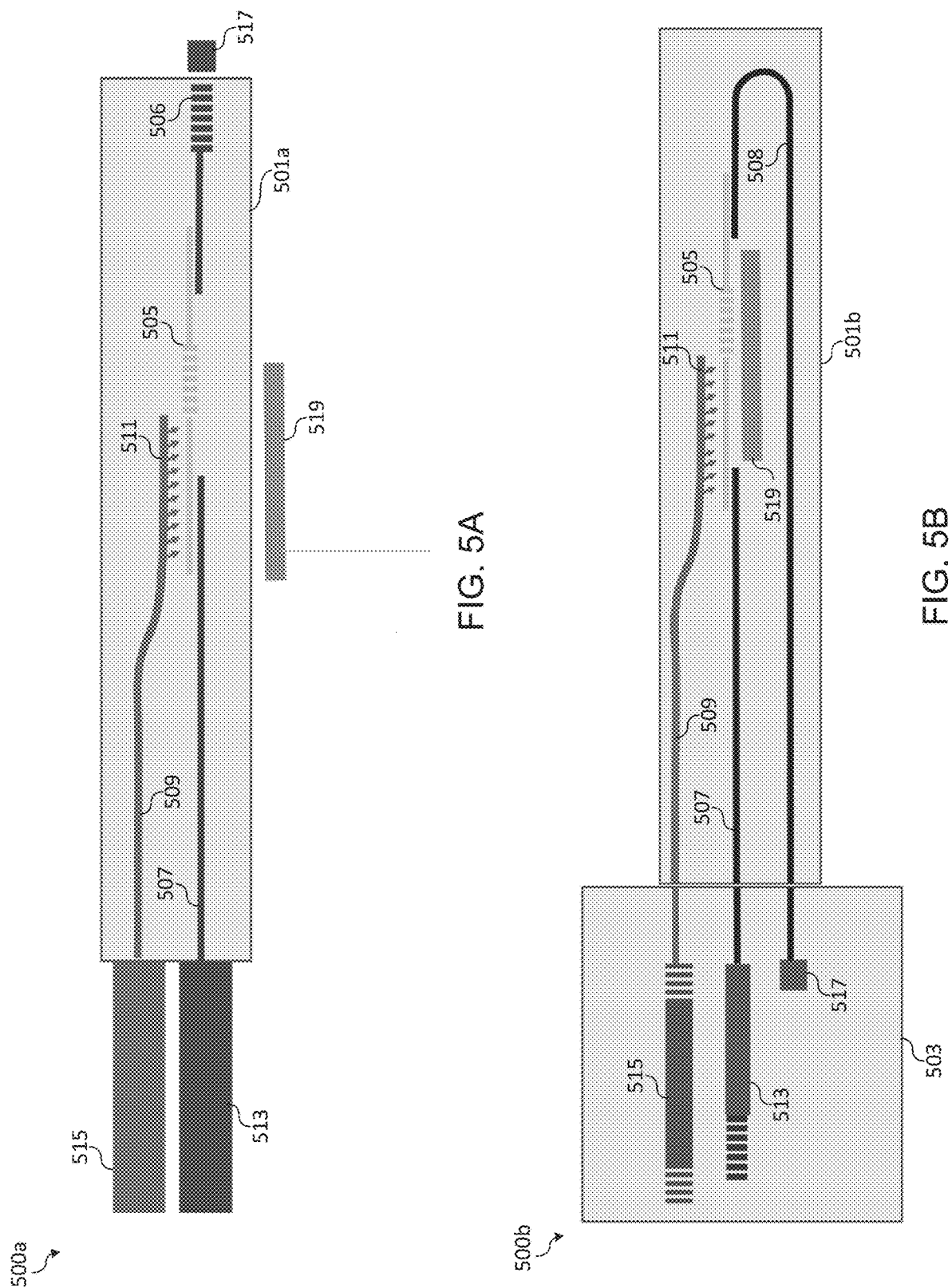

INTEGRATED PHOTONIC RESPONSIVE MATERIAL SENSOR

STATEMENT REGARDING FEDERALLY SPONSORED RESEARCH OR DEVELOPMENT

This invention was made with Government support under FA8650-20-C-7034 awarded by Air Force Research Laboratory-Wright Research. The Government has certain rights in the invention.

BACKGROUND

Many applications use precise measurements of magnetic fields. In particular, many applications benefit from a measurement of the vector magnetic fields to produce a more detailed map of the magnetic field. For example, applications may measure magnetic fields in anomaly-based navigation and dipole beacon-based navigation. These applications typically require magnetic sensors with high sensitivity; low size, weight, and power; and the ability to operate in an earth field. Some technologies (i.e., superconducting quantum interference device (SQUID), atomic-based magnetometry) can provide high sensitivity that is useful in certain applications. However, some of these technologies have drawbacks. For example, SQUID uses cryogenic refrigeration, which adds to the size and power consumption of the magnetometer. Moreover, atomic-based magnetometers are unable to operate in an earth field. Further, the technologies mentioned above use at least three sensors to provide vector information.

SUMMARY OF INVENTION

The following summary is made by way of example and not by way of limitation. It is merely provided to aid the reader in understanding some of the aspects of the subject matter described.

Systems for an integrated photonic responsive material sensor are described herein. In certain embodiments, a system includes a carrier wafer, where the carrier wafer includes at least one cavity formed in a wafer. The carrier wafer also includes a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects. Additionally, the system includes one or more components coupled to the carrier wafer, wherein the one or more components comprises a probe light source that generates the probe light, wherein the one or more components are positioned in relation to the carrier wafer to couple the probe light into the at least one cavity.

BRIEF DESCRIPTION OF THE DRAWINGS

The present invention can be more easily understood and further advantages and uses thereof will be more readily apparent, when considered in view of the detailed description and the following figures in which:

FIGS. 5A and 5B are illustrations of different systems for detecting magnetic fields according to an example aspect of the present invention.

In accordance with common practice, the various described features are not drawn to scale but are drawn to emphasize specific features relevant to the present invention. Reference characters denote like elements throughout Figures and text.

DETAILED DESCRIPTION

Figure 1:
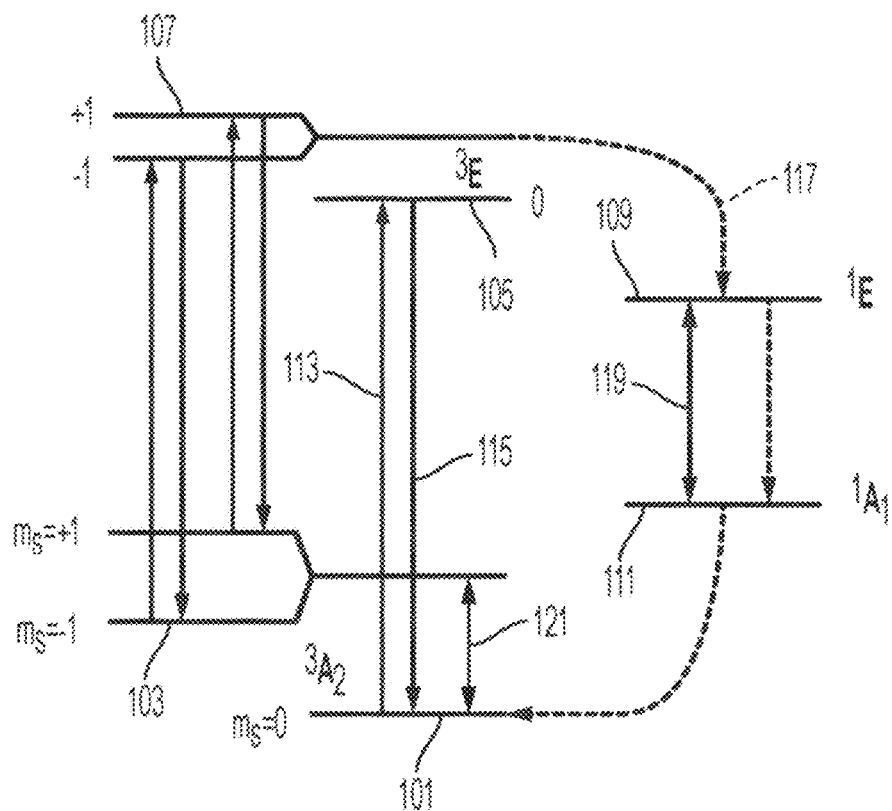
FIG. 1 is a diagram illustrating transitions between the various states in responsive material that is sensitive to magnetic fields according to an example aspect of the present invention.

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

The present disclosure describes systems and methods for coupling a circuit wafer to additional components that work together to detect magnetic fields. In particular, a system can include a material having point defects within a particular material to interact with other components to detect magnetic fields. Some of these components can be integrated onto a carrier wafer, where the additional components can be coupled to the circuit wafer. The additional components may be coupled to the circuit wafer as separate components, as part of an additional integrated wafer, or as combinations of separate and integrated components. Coupling the carrier wafer to additional components as described herein may improve the ability to fabricate more magnetometers that operate with increased accuracy.

Many high-sensitivity magnetometers are bulky, power-hungry, or require cryogenic refrigeration. As such atomic-based magnetometers have been created to address some of the drawbacks of traditional high-sensitivity magnetometers. However, these atomic-based magnetometers are unable to operate in earth fields and suffer from "dead spots" when deployed in operation. Accordingly, a system based on fully integrated photonics may increase the manufacturability while providing the desired performance.

An example of the systems described herein can provide the desired functionality while increasing manufacturability by decoupling the integration of waveguides of different materials from processes for integrating active components. Magnetometers can be made using a responsive material that is responsive to magnetic field changes. Examples of responsive materials include nitrogen-vacancy (NV) diamond, silicon carbide, or other materials with similar characteristics. The responsive material that is responsive to magnetic field changes absorbs probe light from a probe light source in the presence of a microwave signal at a resonant frequency after being prepared by a pump light from a pump light source as discussed below. The resonant frequency will change in response to changes in magnetic fields applied to the responsive material. Further, by directing the pump light from the pump light source out of a pump waveguide and towards the responsive material using diffractive optics, the amount of the probe light absorbed by the material of the probe waveguide will vary in response to the strength of magnetic fields experienced by the probe waveguide.

However, developing a fully integrated photonic system for detecting magnetic fields having the above components is complex, as a fully integrated photonic system would call for the integration of active components used for laser production and detection along with waveguides of different materials onto a single chip. Accordingly, systems and methods described herein may integrate some of the components for magnetometer detection onto a carrier wafer, where the carrier wafer has the responsive material and waveguides for directing at least the probe light through the responsive material and coupling other components to the carrier wafer. In some embodiments, the other components are coupled separately to the carrier wafer. Alternatively, passive components can be integrated into the carrier wafer and active components (like components used for laser production and light detection) can be integrated onto a separate wafer, which is then coupled to the carrier wafer. Thus, by separating the manufacturing of complex components and then coupling the different components to the carrier wafer, the different components can be separately tested and verified before being assembled, leading to increased yield and manufacturability.

Referring to FIG. 1, a diagram illustrating transitions between the various states in responsive material that is sensitive to magnetic fields is provided. As discussed above, certain materials, such as NV diamond, may have certain physical characteristics that allow the material to be responsive to a magnetic field. As used herein, NV diamond may refer to a diamond material having multiple point defects, where a point defect is a nearest-neighbor pair of a nitrogen atom substituted for a carbon atom and a lattice vacancy.

As illustrated, an exemplary responsive material that responds to magnetic fields may have a ground state that is a spin-triplet state. In particular, a spin-triplet ground state may have three spin projections: a ground antiparallel spin 101 of spin projection 0 and two ground parallel spins 103 with spin projections of +/−1. The ground antiparallel spin 101 and the ground parallel spins 103 are separated by a resonant frequency 121. For example, in the absence of a magnetic field, when the responsive material is NV diamond, the resonant frequency 121 may equal 2.87 GHz. Additionally, point defects within the responsive material may be optically excited through spin-conserving transitions to a spin-triplet excited level. The spin-triplet excited level also has multiple spin projections: an excited antiparallel spin 105 of spin projection 0 and excited parallel spins 107 with spin projections of +/−1. The point defects of the responsive material become optically excited by exposure to pump light having a particular frequency. For example, in NV diamond, laser light having a wavelength of 532 nm may cause spin-conserving transitions from the ground triplet states to the excited triplet states.

When point defects within the responsive material are in an excited state, the defects may relax either through a radiative transition 115 or through an intersystem crossing 117. When point defects relax through a radiative transition 115, the point defects may fluoresce and return to one of the ground triplet states. For example, an NV diamond point defect fluoresces by emitting light with a wavelength of 637 nm during a radiative transition 115. Conversely, when point defects relax through an intersystem crossing 117, the point defects do not fluoresce and transition to a shelved state. A shelved state may be a shelved ground state 111 or a shelved excited state 109. Additionally, when point defects are in one of the shelved states 109 and 111, the point defects may absorb energy from the probe light from a probe light source having a particular frequency. For example, NV diamond point defects in one of the shelved states 109 and 111 may absorb energy from probe light of a probe light source having a wavelength of 1042 nm and transition 119 between states 111 and 109.

In certain embodiments, applying a microwave frequency signal to the responsive material that is responsive to magnetic field changes increases the rate of intersystem crossings 117 compared to radiative transition 115. In the responsive material, non-radiative intersystem crossings 117 may be strongly spin selective. For example, point defects having a parallel spin 107 are more likely to experience an intersystem crossing 117 to one of the shelved states 109 and 111. In contrast, point defects having the excited antiparallel spin 105 are more likely to experience a radiative transition back to the ground triplet state. Applying a microwave frequency signal to the responsive material at a resonant frequency 121 increases the probability that the point defects have a parallel spin 107, increasing the probability of intersystem crossings 117. For example, the resonant frequency 121 may be 2.87 GHz when the material is NV diamond. Accordingly, applying a radio frequency of 2.87 GHz to the material may increase the probability of intersystem crossings 117 to one of the shelved states 109 and 111.

Additionally, applying a microwave signal at the resonant frequency 121 to the responsive material, increases the population of point defects at the shelved states 109 and 111. Thus, the responsive material is more likely to absorb the light energy from the probe light source. Accordingly, when the probe light is applied to the responsive material without the microwave signal at the resonant frequency 121, the responsive material absorbs the energy of the probe light with less frequency. For example, applying a microwave signal having a resonant frequency 121 of 2.87 GHz to NV diamond material causes the NV diamond material to absorb the energy of the probe light from the probe light source having a wavelength of 1042 nm at an increased rate.

Further, the resonant frequency 121 for the responsive material may change in the presence of a magnetic field. For example, when the responsive material is exposed to a magnetic field, the Zeeman effect may cause the resonant frequency 121 to experience a shift in proportion to the strength of the experienced magnetic field. In particular, in the presence of a magnetic field, the resonant frequency 121 may split into two different resonant frequencies 121, where the difference between the two resonant frequencies 121 is proportional to the experienced magnetic field. Accordingly, some systems may identify the resonant frequency 121 at which point defects absorb energy from probe light from the probe light source to determine the strength of a magnetic field experienced by the material that is responsive to magnetic field changes.

Additionally, the point defects within the material may be in one of several orientations. For example, when the material is NV diamond, each point defect may be in one of four different orientations. Additionally, the material may have many point defects in each of the four orientations. Accordingly, a system may identify vector information for a magnetic field based on electrical signals that detect the probe light from the probe light source applied to the material. For example, when the material is exposed to a magnetic field, the resonant frequencies 121 for a point defect may shift based on the orientation of the point defect in relation to the experienced magnetic field. Thus, when the point defects in the material are in multiple different orientations, the point defects in the material may have separate resonant frequencies associated with each of the different orientations of the point defects. Therefore, vector information for the magnetic field may be determined by identifying which resonant frequencies correspond to the different orientations of the point defects in the material. In some implementations, systems apply biased magnetic fields to the material when determining which resonant frequencies are associated with particular orientations of the point defects.

A magnetometer may incorporate the responsive material and include components to direct pump light to illuminate the point defects within the material such that the point defects move to the excited triplet state in some embodiments. The magnetometer may also include components that generate and expose the material to RF energy in frequencies that include the resonant frequency 121 for the material. As described above, the probability of intersystem crossings 117 to shelved states 109 and 111 increases at the resonant frequency 121. Additionally, the magnetometer may include components that generate and direct the propagation of the probe light to expose the material to the probe light generated by the probe light source. As described above, point defects in the shelved states 109 and 111 may absorb energy from the probe light and transition 119 between states 111 and 109. Accordingly, the components associated with the RF energy may sweep the applied microwave signal through a range of frequencies to identify the resonant frequencies 121 associated with the different orientations of the point defects within the material. The magnetometer or connected system may identify the resonant frequencies 121 based on a detected decrease in the intensity of the probe light passing through the responsive material. The intensity of the probe light decreases because the point defects at the shelved state absorb the energy of the probe light. Based on the identified resonant frequencies 121, the magnetometer or connected system may calculate the magnetic field experienced by the responsive material.

Figure 2:
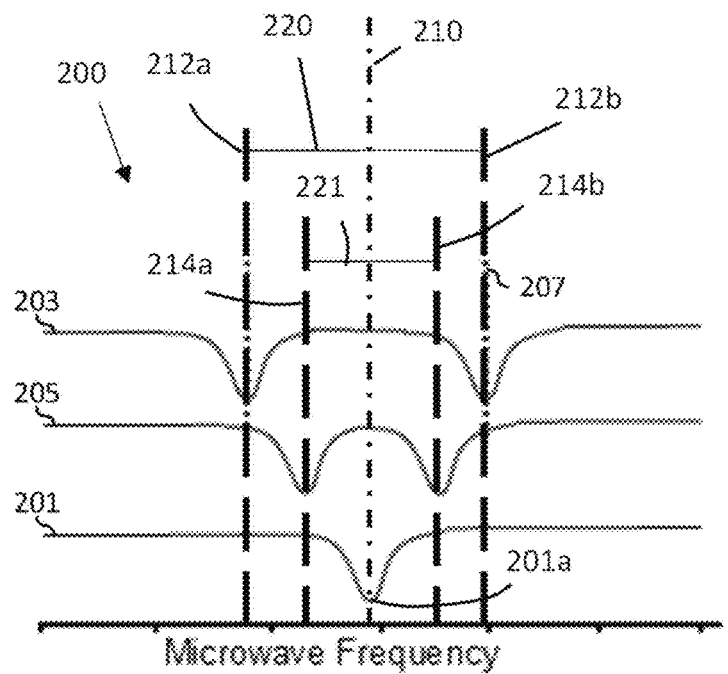
FIG. 2 is a magnetic field strength verses microwave frequency graph according to an example aspect of the present invention.

FIG. 2 is a graph illustrating the detection of a magnetic field based on identifying resonance lines in an applied microwave field that is swept through a range of frequencies. As described above, responsive material is responsive to a magnetic field in that the resonance frequency of the responsive material will change due to the magnetic field. By exposing the responsive material to varying microwave frequencies (scan with the frequencies), the resonance frequencies can be determined by measuring the probe light output from the responsive material (i.e., at resonance, more of the light energy will be absorbed by the responsive material so the intensity of the outputted probe light will decrease). A difference between resonant frequencies is associated with the strength of the magnetic field experienced by the responsive material.

FIG. 2 illustrates a magnetic field strength versus microwave frequency graph 200. The graph 200 illustrates how the strength or intensity of a magnetic field affects the resonant frequency in the responsive material in the presence of a magnetic field. In this example, plot line 201 indicates when a probe light is introduced into the material in the absence of a magnetic field. In this situation, the responsive material does not experience a Zeeman shift, and the energy of a probe light is absorbed at a single resonant frequency 201a. This single resonant frequency may be detected, by measuring the probe light at an output of the material. At the resonance frequency, the measured probe light signal strength at the output will be lower because the responsive material absorbs some of the energy of the probe light. The resonant frequency when a magnetic field is not present may be used as a base resonant frequency 210.

When the material is exposed to a magnetic field, the resonant frequency changes. Plot lines 203 and 205 indicate situations where the material is being exposed to magnetic fields of different strengths. As plot line 203 illustrates, two resonant frequencies 212a and 212b occur in response to this first magnetic field, and as plot line 205 illustrates two different resonant frequencies 214a and 214b occur in response to this second magnetic field. As discussed above, a difference 220 and 221 between resonant frequencies 212a and 212b or 214a and 214b is associated with the strength of the magnetic field experienced by the responsive material. In this example, the magnetic field strength experienced by the responsive material associated with the plot line 203 is greater than the magnetic field strength experienced by the material associated with the plot line 205, as evidenced by the differences 220 and 221. Accordingly, the magnitude of the difference between resonant frequencies is greater when the material is exposed to a greater magnetic field strength. Embodiments identify the resonant frequencies 212a and 212b or 214a and 214b by identifying the frequencies associated with decreases in the intensity of the probe light after passing through the responsive material.

Figure 3:
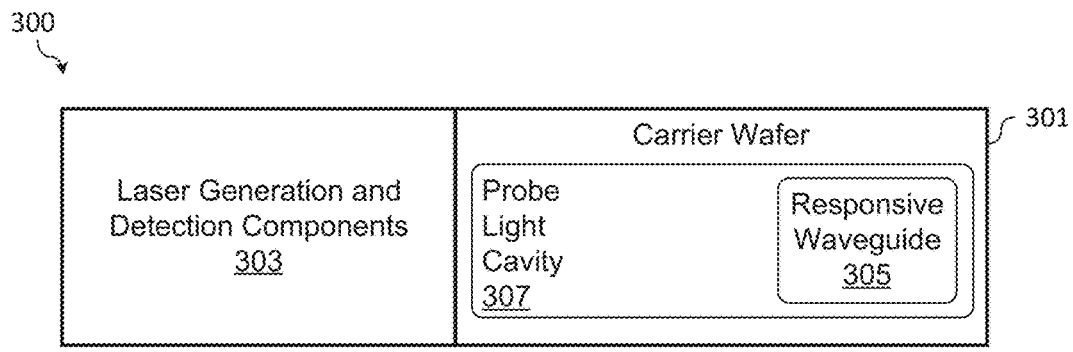
FIG. 3 is a block diagram of a system for detecting magnetic fields according to an example aspect of the present invention.

FIG. 3 is a block diagram of a system 300 for detecting magnetic fields using a responsive waveguide 305 composed of resonant material as described above mounted on a carrier wafer 301. Further, the system 300 may include additional laser generation and detection components 303 that aid in producing light for the responsive waveguide 305 and for detecting magnetic field strengths. Some or all of the laser generation and detection components 303 may be mounted on an additional wafer that couples with the carrier wafer 301. Further, the carrier wafer 301 may also include a probe light cavity 307 that couples a probe light produced by the laser generation and detection components 303 into and out of the responsive waveguide 305. As described above, by fabricating some of the components of a magnetometer onto a carrier wafer 301 and other components on at least one separate device, the different components of the system 300 may be separately tested while simplifying the fabrication process. Accordingly, fabrication processes for the system 300 may produce high yields of accurate devices.

To detect a magnetic field using responsive material, such as the material used to fabricate the responsive waveguide 305, a system 300 may include a probe light source that produces a probe light, a pump light source that produces a pump light, and systems for providing both the probe light and the pump light to the responsive waveguide 305 (such as the probe light cavity 307). Additionally, the system 300 may include a detector(s) for detecting the probe light after passing through the responsive waveguide 305. Further, the system may include an RF signal source that emits RF energy that is swept through a range of frequencies associated with a potential range of magnetic fields. Further, the system 300 may be coupled to a processor, controller, or circuitry that is able to both determine the magnetic field experienced by the system 300 and control the operation of the system 300.

As described above, the system 300 may include a probe light source and a pump light source. In certain embodiments, the probe light source includes an electrical device that functions as an energy source within a gain region for the probe light source. The energy source stimulates the emission of photons in the probe gain region through electronic or molecular transitions between energy states as energy (light beams), which are reflected between mirrors located on opposite ends of the probe gain region. The produced probe light, generated by the probe light source, will have a frequency that is absorbed by the point defects in the shelved state in responsive material. Accordingly, the probe light is coupled to a probe light cavity that directs the probe light into the responsive waveguide 305. While the probe light is described above as being generated within an active gain medium pumped electrically, the active gain medium may also be pumped optically. Further, the probe light may be produced with other types of devices suitable for generating light.

In a similar manner, the pump light source includes an electrical device that functions as an energy source within a gain region for the pump light source. The energy source stimulates the emission of photons in the pump gain region through electronic or molecular transitions between energy states as energy (light beams), which are reflected between mirrors located on opposite ends of the pump gain region. The produced pump light, generated by the pump light source, will have a frequency suitable for preparing point defects for absorption of the probe light. As such, the pump light can be coupled into optical delivery systems that direct the pump light onto the responsive waveguide 305. While the pump light is described above as being generated within an active gain medium pumped electrically, the active gain medium may also be pumped optically. Further, the pump light may be produced with other types of devices suitable for generating light.

As mentioned above, the system may also include an RF signal source that radiates RF energy at the responsive waveguide 305 through a range of frequencies associated with the expected magnetic field. For example, an electric lead can couple power to a microwave (MW) antenna that generates microwave signals that form a microwave field that engages the responsive waveguide 305. The frequency of the microwave field is varied. In one example, the microwave field is varied about a frequency of approximately 2.8 GHz.

In certain embodiments, the probe light output from the responsive waveguide 440 is coupled by the probe light cavity 307 to a detector such as a photodiode sensor that is positioned to sense the intensity of probe light output from the probe light cavity 307. The detector can convert the received probe light into an electrical signal that is provided to a processor or other computing device that determines the magnetic field strength based on the intensity of the detected probe light and the frequency of the RF energy provided to the responsive waveguide 305.

As described below, some of the components can be formed in/on a carrier wafer 301, such as a silicon wafer. In particular, the probe light cavity 307 and the responsive waveguide 305 can be formed on the carrier wafer 301. Active components, like the probe light source and the pump light source may be fabricated as separate components or formed in/on a separate wafer. As the integrated photonic fabrication process for active components, like light sources, is complex and different from complex processes for fabricating passive components having diamond waveguides, separating the components into different fabrication processes can facilitate fabrication of the system 300.

Figure 4A:
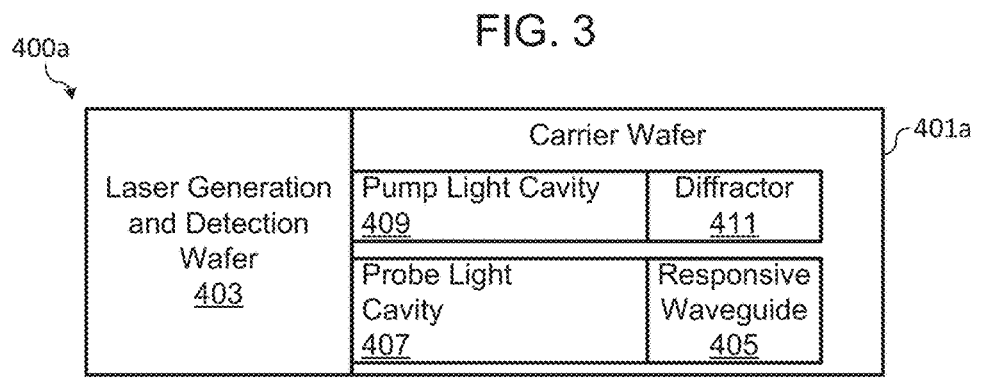
FIGS. 4A-4C illustrate block diagrams of systems for detecting magnetic fields according to an example aspect of the present invention.
Figure 4B:
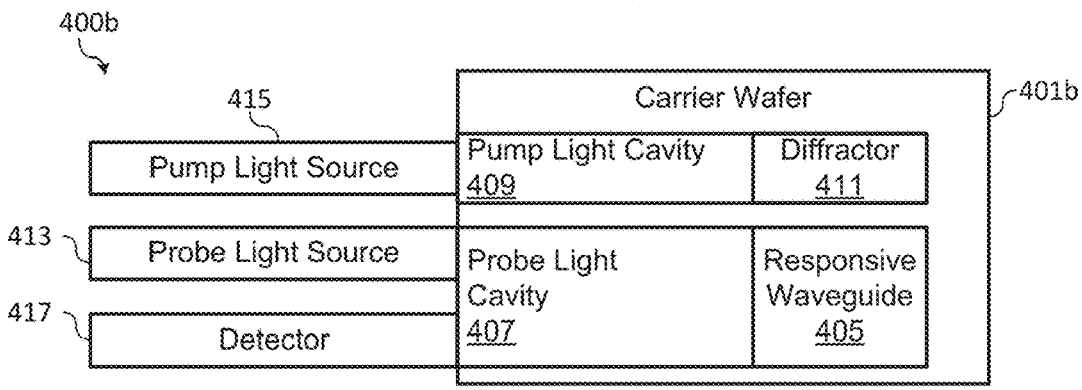
Figure 4C:
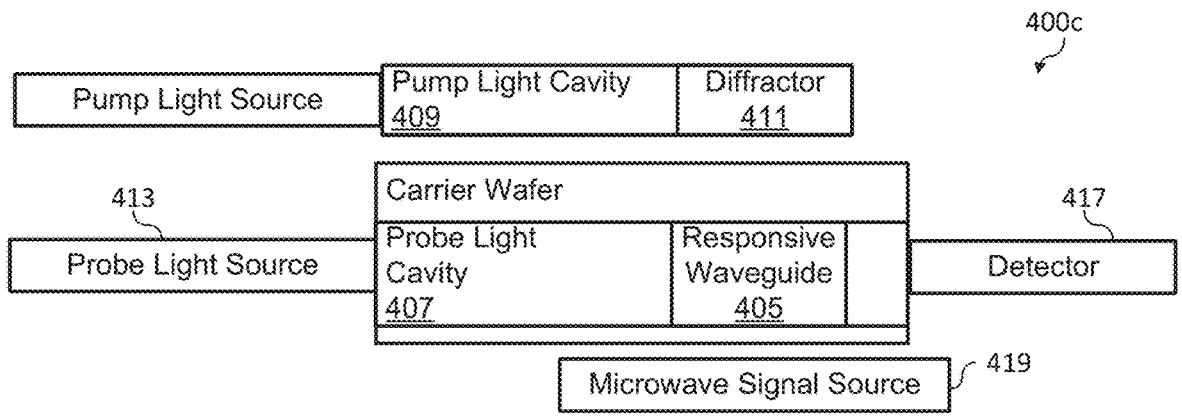

FIGS. 4A-4C illustrate different combinations of components within a system, such as the system 300 described in relation in FIG. 3. For example, FIG. 4A is a block diagram of a system 400a having components fabricated on a carrier wafer 401a and other components fabricated on a laser generation and detection wafer 403. FIG. 4B is a block diagram of a system 400b having components fabricated on a carrier wafer 401 and other components separately mounted to the carrier wafer 401b. FIG. 4C is a block diagram of another system 400c having components fabricated on a carrier wafer 401 and other components separately mounted to the carrier wafer 401c.

For example, FIG. 4A illustrates a system 400a with passive components mounted to a carrier wafer 401a and active components mounted to a laser generation and detection wafer 403. As illustrated, the components mounted on the carrier wafer 401a may include the waveguides and optics that receive the probe light and pump light and convey the probe and pump light to and from the responsive material. In particular, the carrier wafer 401a may include a probe light cavity 407 that is coupled to both an input and output of a responsive waveguide 405. In particular, as the probe light is coupled into the probe light cavity 407, the probe light propagates through the probe light cavity 407 into an input of the responsive waveguide 405. After passing through the responsive waveguide 405, the responsive waveguide 405 provides the probe light through an output to the probe light cavity 407. The probe light cavity 407, then provides the output probe light to a probe light output for the carrier wafer 401a. Additionally, the carrier wafer 401a may include a pump light cavity 409 that is coupled to a diffractor 411. As the pump light is coupled into the pump light cavity 409, the pump light propagates through the pump light cavity 409 to the diffractor 411, where the diffractor 411 provides the light to the diffractor 411. The diffractor 411 then diffracts the pump light out of the pump light cavity 409 through the carrier wafer 401 to the responsive waveguide 405.

In further embodiments, the system 400a includes active components mounted to a laser generation and detection wafer 403. For example, the laser generation and detection wafer 403 may be an integrated photonics device having a pump light source, a probe light source, and a detector. Further, the laser generation and detection wafer 403 may include two output ports, a pump light output and a probe light output. The laser generation and detection wafer 403 may also include an input coupled to the detector. The pump light source generates the pump light, which is then emitted through the pump light output. The probe light source generates the probe light, which is emitted through the probe light output. Light received through the input is coupled to the detector.

In certain embodiments, the laser generation and detection wafer 403 may be coupled to the carrier wafer 401a such that the light emitted by the laser generation and detection wafer 403 is coupled into the carrier wafer 401a, and light emitted by the carrier wafer 401a is coupled into the laser generation and detection wafer 403. For example, the probe light is emitted from the laser generation and detection wafer 403 and coupled into the probe light cavity 407 on the carrier wafer 401a. Similarly, the pump light is emitted from the laser generation and detection wafer 403 and coupled into the pump light cavity 409 on the carrier wafer 401a. Additionally, the carrier wafer 401a emits the output probe light from the responsive waveguide 405, which is coupled into a waveguide on the laser generation and detection wafer 403 for detection by the detector.

In the system 400a, the active components on the laser generation and detection wafer 403 may be fabricated using similar fabrication processes. Additionally, the active components on the laser generation and detection wafer 403 can be tested and calibrated before coupling to the carrier wafer 401a. Similarly, the passive components on the carrier wafer 401a may be fabricated using similar fabrication processes that are different from the fabrication processes used to fabricate the active components. Also, the passive components on the carrier wafer 401a can be tested and calibrated before coupling to the laser generation and detection wafer 403. Thus, the fabrication and testing process may be more efficient and lead to more accurate components.

FIG. 4B is a block diagram of a system 400b having components fabricated on a carrier wafer 401b and other components separately mounted to the carrier wafer 401b. For example, the carrier wafer 401b may be similar to the carrier wafer 401a. However, the active components described as being mounted as part of the laser generation and detection wafer 403 in FIG. 4A may also be mounted as separate devices that are coupled to the carrier wafer 401b. For example, the system 400b includes a probe light source 413, a pump light source 415, and a detector 417. The probe light source 413 may be a device that provides light at the probe light frequencies described above, and the pump light source 415 may be a device that provides light at the pump light frequencies described above. The detector 417 may be any device capable of detecting the output probe light emitted from the carrier wafer 401b.

In certain embodiments, the pump light source 415 may be directly coupled to the carrier wafer 401b such that the pump light source 415 emits the pump light into an input for the pump light cavity 409. Alternatively, intervening optical components (such as free-space optics, optical fibers, waveguides, etc.) may couple the pump light source 415 to an input for the pump light cavity 409 on the carrier wafer 401b. Similarly, the probe light source 413 may be directly coupled to the carrier wafer 401b such that the probe light source 413 emits the pump light into an input for the probe light cavity 407 on the carrier wafer 401b. Also, intervening optical components may couple the probe light source 413 to an input for the probe light cavity 407 on the carrier wafer 401b. Likewise, the detector 417 may be directly coupled to the carrier wafer 401b such that the detector 417 receives light emitted from an output of the probe light cavity 407 on the carrier wafer 401b.

FIG. 4C is a block diagram of a system 400c that is similar to the system 400b of FIG. 4B save that a circuit wafer 401c has fewer components than the circuit wafer 401b in FIG. 4B. In particular, the probe light source 413, pump light source 415, and detector 417 may function in a similar manner as described in relation to FIG. 4B. However, as illustrated in FIG. 4C, the carrier wafer 401c may include a probe light cavity 407, and responsive waveguide 405 as described above in FIGS. 4A and 4B but the pump light cavity 409 and diffractor 411 may be separate components mounted to the carrier wafer 401c. Additionally, the system 400c may include a microwave signal source 419 that emits RF signals towards the responsive waveguide 405. As the system 400c has multiple separate components, the components may be separately tested and calibrated before coupling to the carrier wafer 401c.

In exemplary embodiments, the pump light source 415 is coupled to a pump light cavity 409, which functions as a propagation medium between the pump light source 415 and a diffractor 411. Further, the diffractor 411 may be positioned to emit the pump light towards the responsive waveguide 405. In additional embodiments, the pump light cavity 409 and the diffractor 411 may be any combination of optical components (waveguides, mirrors, diffractors, optical fibers, etc.) that are able to convey the pump laser emitted from the pump light source 415 to the responsive waveguide 405.

FIGS. 5A and 5B are diagrams of magnetometers having carrier wafers. For example, FIG. 5A is a diagram of a magnetometer 500a where multiple components are mounted on a carrier wafer 501a, and FIG. 5B is a diagram of a magnetometer 500b where one group of components are mounted on a laser generation and detection wafer 503 and another group of components are mounted on a carrier wafer 501b.

Referring to FIG. 5A, the magnetometer 500a may include a pump laser source 515 and probe laser source 513 separately mounted to a silicon carrier wafer 501a. The probe laser source 513 and pump laser source 515 may be similar to the probe laser source 413 and pump laser source 415 described above in FIGS. 4B and 4C. Probe light generated by the probe laser source 513 is coupled into a probe light cavity 507 towards a responsive waveguide 505, where the probe light cavity 507 and the responsive waveguide 505 are both formed on the carrier wafer 501a. Also, pump light generated by the pump laser source 515 is coupled into a pump light cavity 509 towards a diffractor 511, where both the pump light cavity 509 and the diffractor 511 are formed on the carrier wafer 501a. The diffractor 511 directs at least some of the pump light coupled into the pump light cavity 509 towards the responsive waveguide 505. As described above, the responsive waveguide 505 includes responsive material that is responsive to a magnetic field such as NV diamond material or other similar material.

Further, a microwave antenna 519 may be coupled to the carrier wafer 501a proximate to the responsive waveguide 505 to generate microwave signals to form a microwave field that engages the responsive waveguide 505. Further, the frequency of the microwave field is varied. For example, the microwave field may be varied about a frequency of approximately 2.8 gHz. Additionally, the remaining (non-absorbed) probe light that is output from the responsive waveguide 505 may be coupled back into the probe light cavity 507 for coupling into an output coupler 506. The output coupler then emits the remaining probe light from the carrier wafer 501a for reception by a detector 517 coupled to the carrier wafer 501a. The detector 517 senses the intensity of the remaining probe light, where the sensed intensity can be used to indicate the resonant frequency of the responsive waveguide 505, where the resonant frequency is indicative of experienced magnetic field strength.

In exemplary embodiments, the responsive waveguide 505 may be fabricated on top of the silicon carrier wafer 501a. The pump light cavity 509 and probe light cavity 507 may be formed in silicon nitride or other conventional protonic material. An adiabatic coupling may be used to couple the generated probe light into and out of the responsive waveguide 505.

Referring to FIG. 5B, a block diagram of a magnetometer 500b, where the magnetometer 500b includes a laser generation and detection wafer 503 mounted to a carrier wafer 501b. The laser generation and detection wafer 503 includes actives components for generating and detecting the probe laser light and for generating the pump laser light. The carrier wafer 501b includes passive components for propagating the probe laser light and the pump laser light towards, through, and from the responsive waveguide 505.

In certain embodiments, the laser generation and detection wafer 503 includes a probe laser source 513 and a pump laser source 515 formed on/in a silicon laser generation and detection wafer 503. The pump laser source 515 may include an active gain region that is positioned between mirrors. Further, an electrical lead may extend to the active gain region and act as an energy source in the active gain region to provide energy to stimulate emission of photons in the gain material through electronic or molecular transitions between energy states as energy (light beams) are reflected between the mirrors, at the frequencies associated with the pump laser light. The pump light generated by the pump laser source 515 may be coupled to an output of the laser generation and detection wafer 503 for coupling into a pump light cavity 509 on the carrier wafer 501*b*.

Further, the probe laser source 513 may include an active gain region that is positioned between mirrors. Further, an electrical lead may extend to the active gain region and act as an energy source in the active gain region to provide energy to stimulate emission of photons in the gain material through electronic or molecular transitions between energy states as energy (light beams) are reflected between the mirrors, at the frequencies associated with the probe laser light. The probe light generated by the probe laser source 513 may be coupled to an output of the laser generation and detection wafer 503 for coupling into a probe light cavity 507 on the carrier wafer 501*b*.

When the pump light is coupled from the laser generation and detection wafer 503 into the pump light cavity 509 on the carrier wafer 501*b* and the probe light is coupled from the laser generation and detection wafer 503 into the probe light cavity 507 on the carrier wafer 501*b*, at least some of the pump light is diffracted through a pump laser diffractor 511 to pass through the responsive waveguide 505. As mentioned above, the responsive waveguide 505 includes responsive material that is responsive to a magnetic field such as NV diamond material. In some implementations, the diffractor 511 progressively emits a larger percentage of the pump light into the responsive waveguide 505 along the length of the diffractor 511.

In certain embodiments, the responsive waveguide 505 is positioned within the carrier wafer 501*b* to receive the probe laser from the probe light cavity 507, where the probe light cavity 507 may be fabricated of silicon nitride or other convention protonic material within the carrier wafer 501*b*. The probe light may be coupled from the probe light cavity 507 into the responsive waveguide 505 using adiabatic coupling or other forms of coupling. The probe light then propagates through the responsive waveguide 505 and the remaining probe light that is not absorbed within the responsive waveguide 505 is coupled out of the responsive waveguide 505 into a detection waveguide 508, where the detection waveguide 508 couples the remaining probe light to an output of the carrier wafer 501*b*. The output of the carrier wafer 501*b* is coupled to a detection input of the laser generation and detection wafer 503 which couples received light for detection by the detector 517.

In additional embodiments, the carrier wafer 501*b* may include a lead coupled to a microwave antenna 519 that generates microwave signals that form a microwave field that engages the responsive waveguide 505. As stated above, the frequency of the microwave field is varied. In one example, the microwave field is varied about a frequency of approximately 2.8 GHz. As the detector 517 detects the remaining probe light, the detector 517 may sense the intensity of probe light. As discussed above, the intensity of the probe light will indicate the resonance which can be used to determine a magnetic field strength.

In certain embodiments, some of the systems and methods described herein are implemented using a computational device or processor. For example, a processor may control the operation of the probe laser source, pump laser source, microwave source, and detector. As such, the processor may perform calculations to identify the magnetic field experienced by the responsive waveguide 505. The processor may be implemented using software, firmware, hardware, or appropriate combinations thereof. In some implementations, a single processor may execute the functionality of any combination of the processor.

The processors or other computational devices may be supplemented by, or incorporated in, specially-designed application-specific integrated circuits (ASICs) or field programmable gate arrays (FPGAs). In some implementations, the processors and/or other computational devices can also include or function with software programs, firmware, or other computer-readable instructions for carrying out various process tasks, calculations, and control functions used in the methods and systems described herein.

Although the above examples discuss the forming of a threshold magnetometer sensor by monitoring shifts in resonate frequencies in the responsive material due to magnetic fields, the same architecture may be applicable to other types of sensors. Any type of sensor that can measure any quantity or force that effects the states of the responsive material, such as NV centers in NV diamond material may use the above discussed architecture. For example, any type of force that causes the responsive material to absorb energy of the probe light may be sensed with the architecture discussed above. Such sensors may include, but are not limited to, NV diamond atomic clocks, gyroscopes, temperature sensors, electric filed sensors, strain sensors, etc. may use the above discussed architecture.

EXAMPLE EMBODIMENTS

Example 1 includes a system comprising: a carrier wafer comprising: at least one cavity formed in the carrier wafer; a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects; and one or more components coupled to the carrier wafer, wherein the one or more components comprises a probe light source that generates the probe light, wherein the one or more components are positioned in relation to the carrier wafer to couple the probe light into the at least one cavity.

Example 2 includes the system of Example 1, wherein the carrier wafer further comprises: a diffractor configured to direct the pump light into the responsive waveguide to excite the point defects in the responsive waveguide; and a pump waveguide coupled to the diffractor.

Example 3 includes the system of Example 2, wherein the one or more components comprises: a pump light source that generates the pump light, wherein the one or more components are positioned in relation to the carrier wafer to couple the pump light into the pump waveguide.

Example 4 includes the system of any of Examples 1-3, wherein the one or more components comprises: a pump light source that generates the pump light; a pump waveguide coupled to receive the pump light from the pump light source; and a diffractor configured to direct the pump light into the responsive waveguide.

Example 5 includes the system of any of Examples 1-4, wherein the one or more components further comprises: a microwave signal antenna configured to generate a microwave field of varying frequencies that engages the responsive waveguide; and at least one sensor to measure an intensity of the probe light that is output from the at least one cavity, the at least one sensor providing a sensor output signal of the intensity of the probe light.

Example 6 includes the system of any of Examples 1-5, wherein the carrier wafer further comprises a microwave signal antenna configured to generate a microwave field of varying frequencies that engages the responsive waveguide.

Example 7 includes the system of any of Examples 1-6, wherein multiple components of the one or more components are mounted on an additional wafer, wherein the additional wafer is coupled to the carrier wafer.

Example 8 includes the system of Example 7, wherein the probe light source and a pump light source are mounted on the additional wafer.

Example 9 includes the system of any of Examples 7-8, wherein a detector is mounted on the additional wafer.

Example 10 includes a system comprising: a carrier wafer comprising: at least one cavity formed in a wafer; and a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects; and a laser generation wafer comprising: a probe light gain medium that generates the probe light; and a pump light gain medium that generates the pump light; wherein the laser generation wafer is positioned in relation to the carrier wafer such that the probe light is coupled into the at least one cavity.

Example 11 includes the system of Example 10, wherein the carrier wafer further comprises: a diffractor configured to direct the pump light into the responsive waveguide to excite the point defects in the responsive waveguide; and a pump waveguide coupled to the diffractor.

Example 12 includes the system of any of Examples 10-11, wherein the pump light is coupled to an optical component for delivery onto the responsive waveguide.

Example 13 includes the system of any of Examples 10-12, further comprising: a microwave signal antenna coupled to the carrier wafer configured to generate a microwave field of varying frequencies that engages the responsive waveguide; and at least one detector to measure an intensity of the probe light that is output from the at least one cavity, the at least one detector providing a sensor output signal of the intensity of the probe light.

Example 14 includes the system of any of Examples 10-13, wherein the carrier wafer comprises a microwave signal antenna configured to generate a microwave field of varying frequencies that engages the responsive waveguide.

Example 15 includes the system of any of Examples 10-14, wherein the laser generation wafer further comprises at least one detector to measure an intensity of the probe light that is output from the at least one cavity, the at least one detector providing a sensor output signal of the intensity of the probe light.

Example 16 includes a system comprising: a carrier wafer comprising: at least one cavity formed in a wafer; a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects; a probe light source that generates the probe light, wherein the probe light source is positioned in relation to the carrier wafer to introduce the probe light into the at least one cavity; and a pump light source that generates the pump light, wherein the pump light source is positioned in relation to the carrier wafer to introduce the pump light into a pump light cavity configured to direct the pump light to the responsive waveguide.

Example 17 includes the system of Example 16, wherein the carrier wafer further comprises the pump light cavity; and a diffractor configured to direct the pump light into the responsive waveguide to excite the point defects in the responsive waveguide.

Example 18 includes the system of any of Examples 16-17, further comprising: a microwave signal antenna configured to generate a microwave field of varying frequencies that engages the responsive waveguide; and at least one detector configured to measure an intensity of the probe light that is output from the at least one cavity, the at least one detector providing a sensor output signal of the intensity of the probe light.

Example 19 includes the system of Example 18, wherein the carrier wafer comprises the microwave signal antenna.

Example 20 includes the system of any of Examples 18-19, wherein the microwave signal antenna is coupled to the carrier wafer.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
 a carrier wafer comprising:
  at least one cavity formed in the carrier wafer;
  a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects; and
 one or more components coupled to the carrier wafer, wherein the one or more components comprises a probe light source that generates the probe light, wherein the one or more components are positioned in relation to the carrier wafer to couple the probe light into the at least one cavity.

2. The system of claim 1, wherein the carrier wafer further comprises:
 a diffractor configured to direct the pump light into the responsive waveguide to excite the point defects in the responsive waveguide; and
 a pump waveguide coupled to the diffractor.

3. The system of claim 2, wherein the one or more components comprises: a pump light source that generates the pump light, wherein the one or more components are positioned in relation to the carrier wafer to couple the pump light into the pump waveguide.

4. The system of claim 1, wherein the one or more components comprises:
- a pump light source that generates the pump light;
- a pump waveguide coupled to receive the pump light from the pump light source; and
- a diffractor configured to direct the pump light into the responsive waveguide.

5. The system of claim 1, wherein the one or more components further comprises:
- a microwave signal antenna configured to generate a microwave field of varying frequencies that engages the responsive waveguide; and
- at least one sensor to measure an intensity of the probe light that is output from the at least one cavity, the at least one sensor providing a sensor output signal of the intensity of the probe light.

6. The system of claim 1, wherein the carrier wafer further comprises a microwave signal antenna configured to generate a microwave field of varying frequencies that engages the responsive waveguide.

7. The system of claim 1, wherein multiple components of the one or more components are mounted on an additional wafer, wherein the additional wafer is coupled to the carrier wafer.

8. The system of claim 7, wherein the probe light source and a pump light source are mounted on the additional wafer.

9. The system of claim 7, wherein a detector is mounted on the additional wafer.

10. A system comprising:
a carrier wafer comprising:
- at least one cavity formed in a wafer; and
- a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects; and a laser generation wafer comprising:
- a probe light gain medium that generates the probe light; and
- a pump light gain medium that generates the pump light;
- wherein the laser generation wafer is positioned in relation to the carrier wafer such that the probe light is coupled into the at least one cavity.

11. The system of claim 10, wherein the carrier wafer further comprises:
- a diffractor configured to direct the pump light into the responsive waveguide to excite the point defects in the responsive waveguide; and
- a pump waveguide coupled to the diffractor.

12. The system of claim 10, wherein the pump light is coupled to an optical component for delivery onto the responsive waveguide.

13. The system of claim 10, further comprising:
- a microwave signal antenna coupled to the carrier wafer configured to generate a microwave field of varying frequencies that engages the responsive waveguide; and
- at least one detector to measure an intensity of the probe light that is output from the at least one cavity, the at least one detector providing a sensor output signal of the intensity of the probe light.

14. The system of claim 10, wherein the carrier wafer comprises a microwave signal antenna configured to generate a microwave field of varying frequencies that engages the responsive waveguide.

15. The system of claim 10, wherein the laser generation wafer further comprises at least one detector to measure an intensity of the probe light that is output from the at least one cavity, the at least one detector providing a sensor output signal of the intensity of the probe light.

16. A system comprising:
a carrier wafer comprising:
- at least one cavity formed in a wafer;
- a responsive waveguide coupled to the at least one cavity, the responsive waveguide formed from responsive material that is responsive to a force by shifting a resonance frequency of point defects in the responsive material in response to the force, wherein a pump light is directed to the responsive waveguide to prepare the responsive waveguide to absorb a probe light when exposed to a radio frequency at the resonance frequency of the point defects;
- a probe light source that generates the probe light, wherein the probe light source is positioned in relation to the carrier wafer to introduce the probe light into the at least one cavity; and
- a pump light source that generates the pump light, wherein the pump light source is positioned in relation to the carrier wafer to introduce the pump light into a pump light cavity configured to direct the pump light to the responsive waveguide.

17. The system of claim 16, wherein the carrier wafer further comprises the pump light cavity; and
- a diffractor configured to direct the pump light into the responsive waveguide to excite the point defects in the responsive waveguide.

18. The system of claim 16, further comprising:
- a microwave signal antenna configured to generate a microwave field of varying frequencies that engages the responsive waveguide; and
- at least one detector configured to measure an intensity of the probe light that is output from the at least one cavity, the at least one detector providing a sensor output signal of the intensity of the probe light.

19. The system of claim 18, wherein the carrier wafer comprises the microwave signal antenna.

20. The system of claim 18, wherein the microwave signal antenna is coupled to the carrier wafer.

* * * * *